United States Patent
Ozeki

(10) Patent No.: US 9,972,752 B2
(45) Date of Patent: May 15, 2018

(54) LIGHT-EMITTING DEVICE MANUFACTURING METHOD

(71) Applicant: NICHIA CORPORATION, Anan-shi, Tokushima (JP)

(72) Inventor: Kenji Ozeki, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 219 days.

(21) Appl. No.: 15/093,162

(22) Filed: Apr. 7, 2016

(65) Prior Publication Data

US 2016/0300984 A1 Oct. 13, 2016

(30) Foreign Application Priority Data

Apr. 8, 2015 (JP) .................................. 2015-079395
Jan. 29, 2016 (JP) .................................. 2016-015240

(51) Int. Cl.
| | |
|---|---|
| H01L 33/50 | (2010.01) |
| H01L 33/56 | (2010.01) |
| H01L 33/60 | (2010.01) |
| H01L 33/48 | (2010.01) |

(52) U.S. Cl.
CPC .......... *H01L 33/504* (2013.01); *H01L 33/486* (2013.01); *H01L 33/56* (2013.01); *H01L 2933/005* (2013.01); *H01L 2933/0041* (2013.01)

(58) Field of Classification Search
CPC ..... H01L 33/504; H01L 33/486; H01L 33/56; H01L 33/60
See application file for complete search history.

(56) References Cited

U.S. PATENT DOCUMENTS

| | | | |
|---|---|---|---|
| 2011/0204400 A1 | 8/2011 | Koizumi et al. | |
| 2014/0124812 A1* | 5/2014 | Kuramoto | ............... H01L 33/54 257/98 |
| 2015/0188004 A1* | 7/2015 | Ozeki | .................. H01L 33/507 257/98 |
| 2016/0020369 A1* | 1/2016 | Ukawa | .................. H01L 33/507 362/311.01 |

FOREIGN PATENT DOCUMENTS

| | | |
|---|---|---|
| JP | 2002-305328 A | 10/2002 |
| JP | 2004-119838 A | 4/2004 |
| JP | 2006-135300 A | 5/2006 |
| JP | 2009-260244 A | 11/2009 |
| JP | 2011-171557 A | 9/2011 |
| JP | 2012-060192 A | 3/2012 |

* cited by examiner

*Primary Examiner* — Seahvosh Nikmanesh
(74) *Attorney, Agent, or Firm* — Hunton Andrews Kurth LLP

(57) ABSTRACT

A light-emitting device having good light extracting efficiency is provided, along with a method for manufacturing the same. A method for manufacturing a light-emitting device includes preparing a base that includes a recess, arranging a light-emitting element on a bottom surface of the recess, dropping a first member into the recess to continuously cover an upper surface of the light-emitting element and an inner wall of the recess by the first member, dropping a second member into the recess, wherein the second member has a higher specific gravity than the first member, and further wherein dropping the second member includes semicuring the first member, and after the second member is dropped, fully curing the first member and the second member.

15 Claims, 19 Drawing Sheets

LIGHT-EMITTING DEVICE MANUFACTURING METHOD

CROSS-REFERENCE TO RELATED APPLICATIONS

The present application claims priority to Japanese Patent Application No. 2015-079395, filed on Apr. 8, 2015, and Japanese Patent Application No. 2016-015240, filed on Jan. 29, 2016, which are incorporated by reference in their entireties.

BACKGROUND OF THE INVENTION

1. Field of the Invention

The present invention relates to a method for manufacturing a light-emitting device.

2. Description of Related Art

A conventional method for manufacturing a semiconductor light-emitting device includes a first step in which a first wavelength conversion layer is applied on light-emitting elements and cured, and a second step in which a second wavelength conversion layer is filled into or applied on the whole of a cavity, in which the light-emitting elements are arranged, and cured. This conventional method is described in Japanese Unexamined Patent Application Publication No. 2006-135300.

However, in this conventional manufacturing method, the first wavelength conversion layer and the second wavelength conversion layer are separately cured, which forms an interface between the first wavelength conversion layer and the second wavelength conversion layer. Total reflection of light emitted from the light-emitting elements may occur at the interface, and the light extracting efficiency of the light-emitting device may be reduced.

SUMMARY OF THE INVENTION

The above-mentioned problems can be solved, for example, by the methods of the present invention described below.

A method for manufacturing a light-emitting device includes preparing a base that includes a recess, arranging a light-emitting element on a bottom surface of the recess, dropping a first member into the recess to continuously cover an upper surface of the light-emitting element and an inner wall of the recess by the first member, dropping a second member into the recess, wherein the second member has a higher specific gravity than the first member, and further wherein dropping the second member includes semi-curing the first member, and after the second member is dropped, fully curing the first member and the second member.

A method for manufacturing a light-emitting device includes preparing a base that includes a recess, arranging a light-emitting element on a bottom surface of the recess, dropping a light reflecting member into the recess, wherein the bottom surface of the recess and a lateral surface of the recess are covered by the light reflecting member, after the light reflecting member is dropped, dropping a first member into the recess to continuously cover an upper surface of the light-emitting element and an inner wall of the recess by the first member, dropping a second member into the recess, wherein the second member has a higher specific gravity than the first member, and after the second member is dropped, fully curing the first member and the second member, wherein the light reflecting member has a higher light reflectivity than the first member and the second member.

According to methods for manufacturing the light-emitting device of the present invention, the light-emitting device having good light extracting efficiency can be provided.

DETAILED DESCRIPTION OF EMBODIMENTS

Light-Emitting Device 100 According to First Embodiment

Figure 1A:
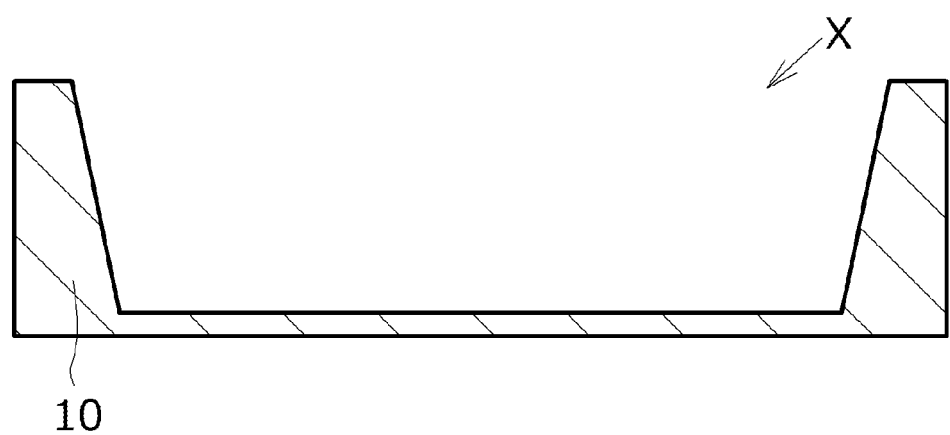
FIG. 1A is a schematic cross-sectional view illustrating a first step of a method for manufacturing a light-emitting device according to a first embodiment.
Figure 1B:
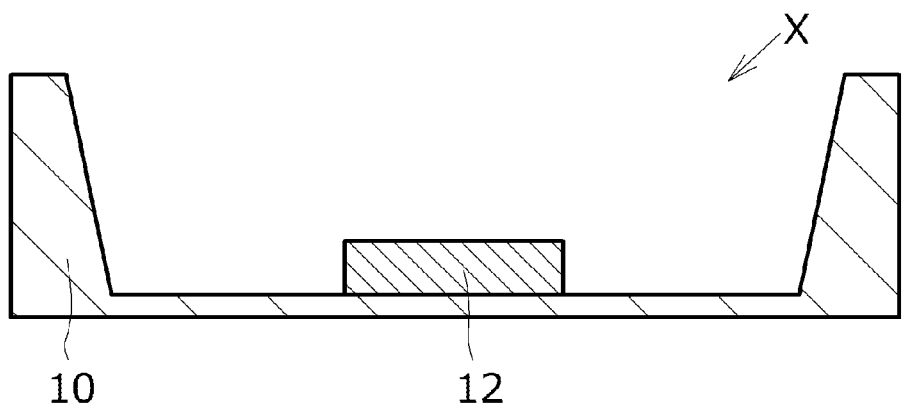
FIG. 1B is a schematic cross-sectional view illustrating a second step of a method for manufacturing a light-emitting device according to the first embodiment.
Figure 1C:
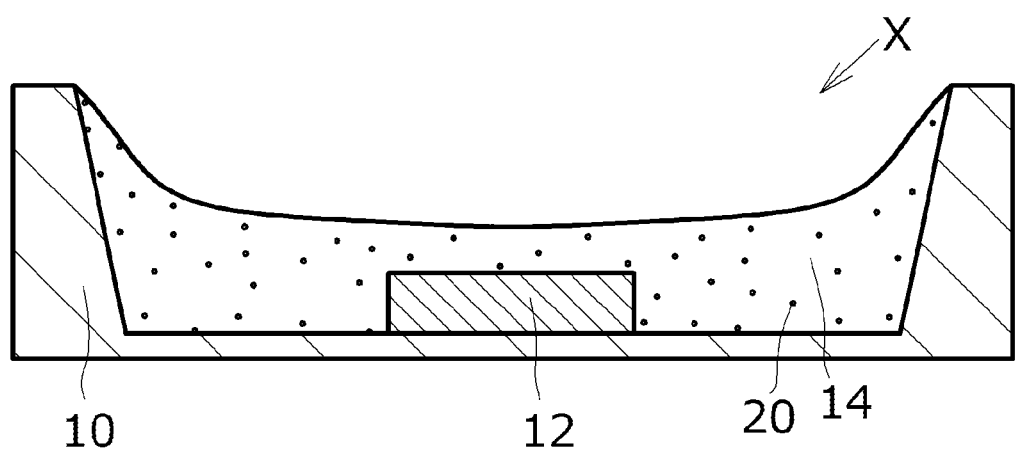
FIG. 1C is a schematic cross-sectional view illustrating a third step of a method for manufacturing a light-emitting device according to the first embodiment.
Figure 1D:
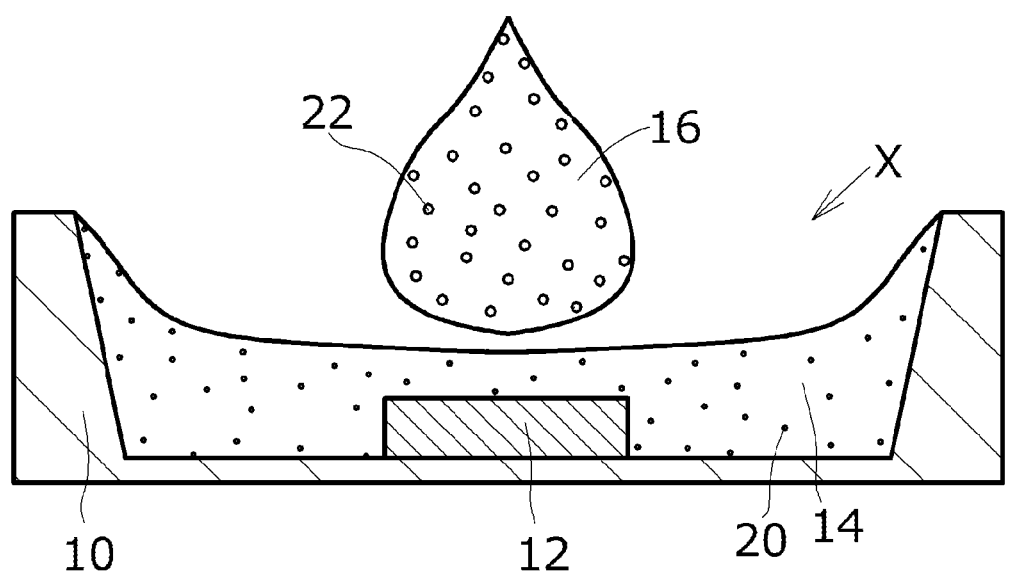
FIG. 1D is a schematic cross-sectional view illustrating a fourth step of a method for manufacturing a light-emitting device according to the first embodiment.
Figure 1E:
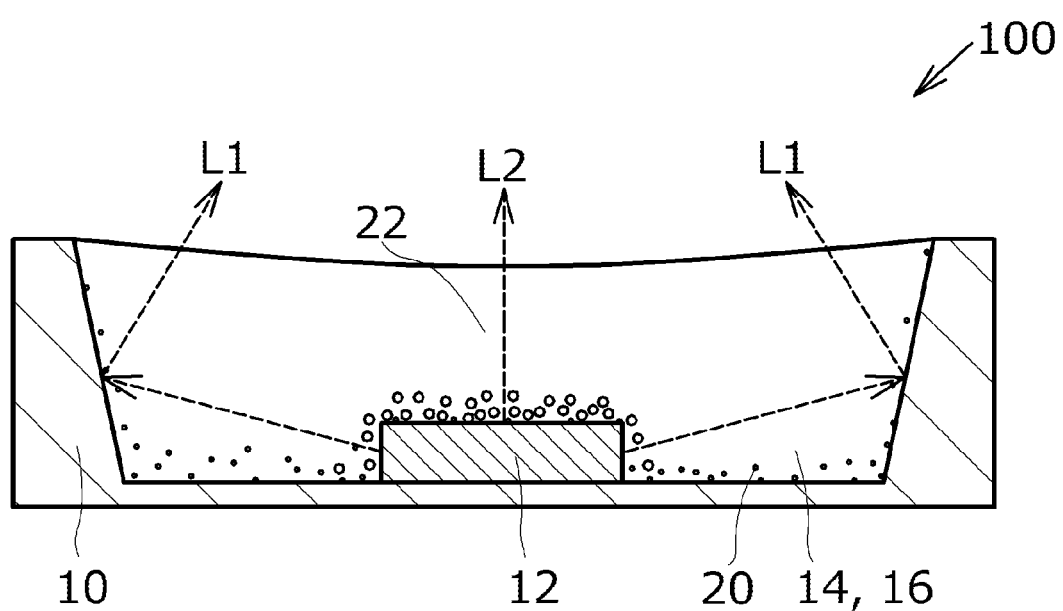
FIG. 1E is a schematic cross-sectional view illustrating a fifth step of a method for manufacturing a light-emitting device according to the first embodiment.
Figure 2A:
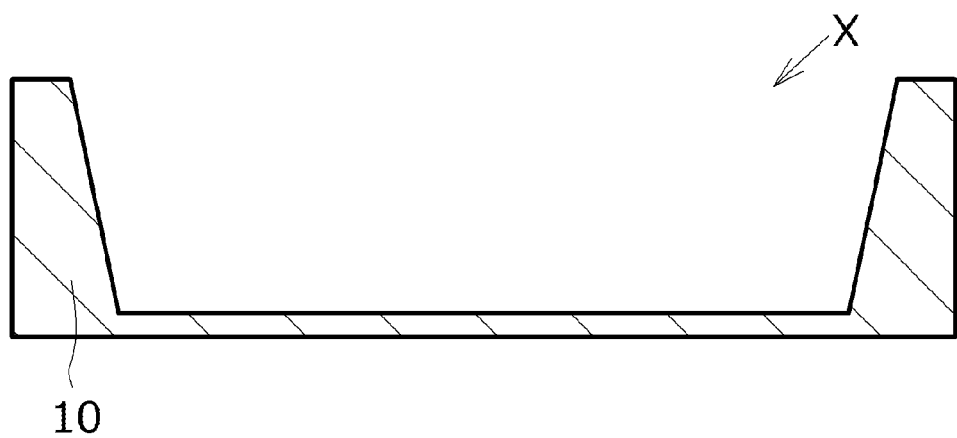
FIG. 2A is a schematic cross-sectional view illustrating a first step of a method for manufacturing a light-emitting device according to a second embodiment.
Figure 2B:
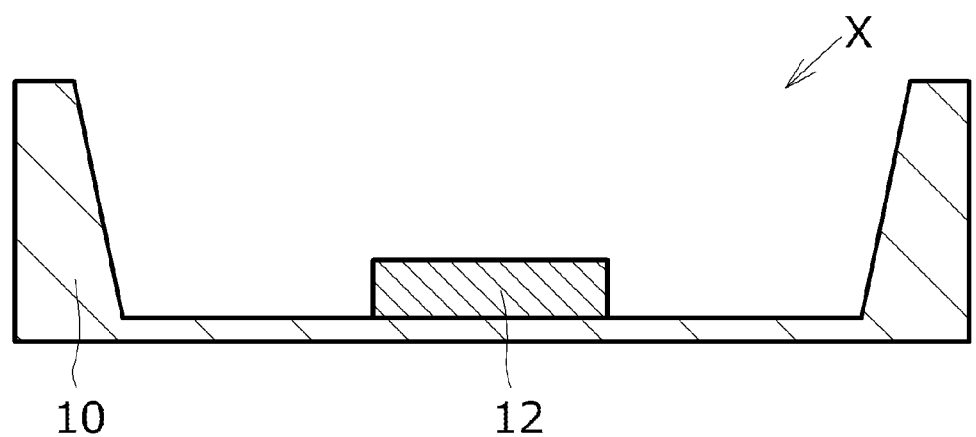
FIG. 2B is a schematic cross-sectional view illustrating a second step of a method for manufacturing a light-emitting device according to the second embodiment.
Figure 2C:
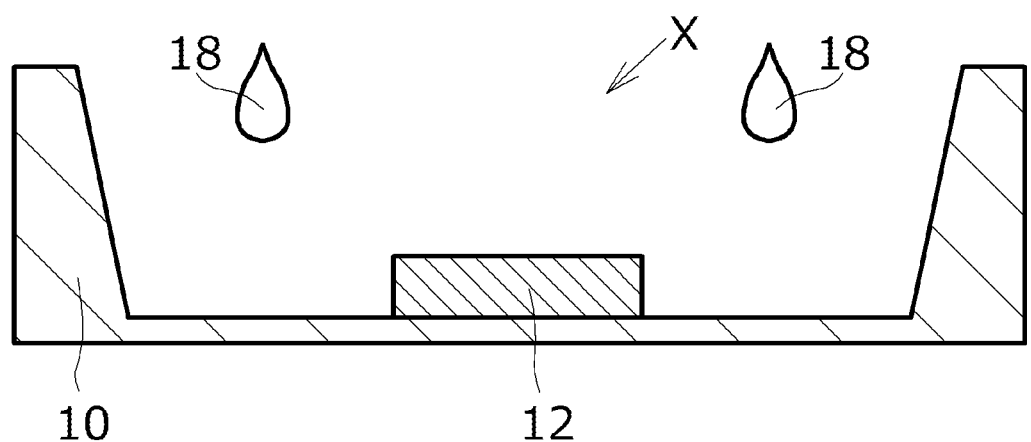
FIG. 2C is a schematic cross-sectional view illustrating a third step of a method for manufacturing a light-emitting device according to the second embodiment.
Figure 2D:
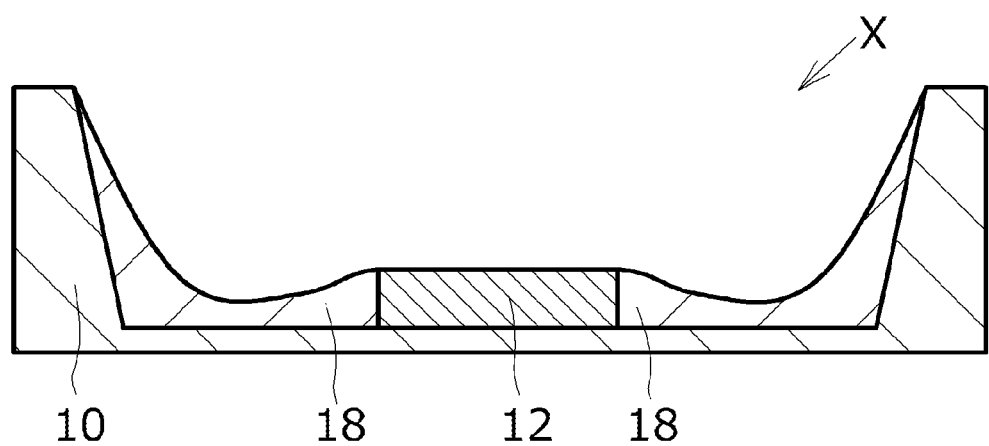
FIG. 2D is a schematic cross-sectional view illustrating a fourth step of a method for manufacturing a light-emitting device according to the second embodiment.
Figure 2E:
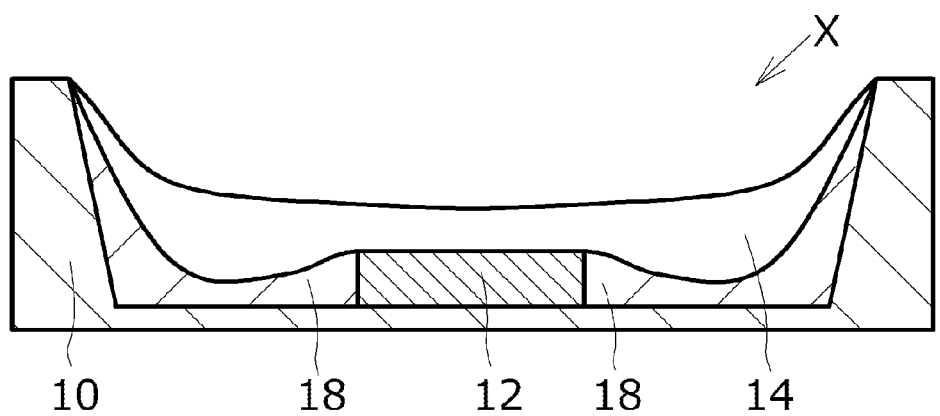
FIG. 2E is a schematic cross-sectional view illustrating a fifth step of a method for manufacturing a light-emitting device according to the second embodiment.
Figure 2F:
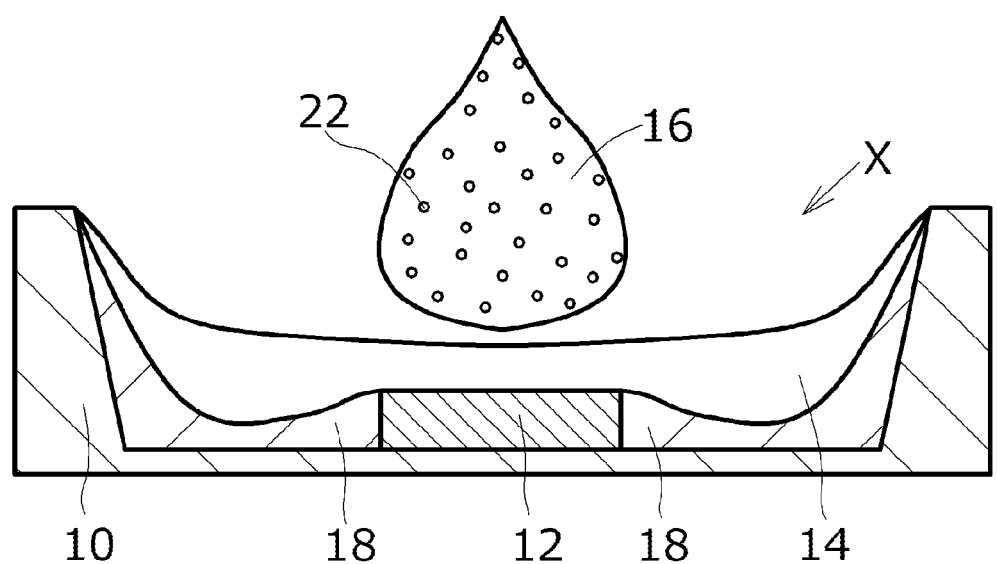
FIG. 2F is a schematic cross-sectional view illustrating a sixth step of a method for manufacturing a light-emitting device according to the second embodiment.
Figure 2G:
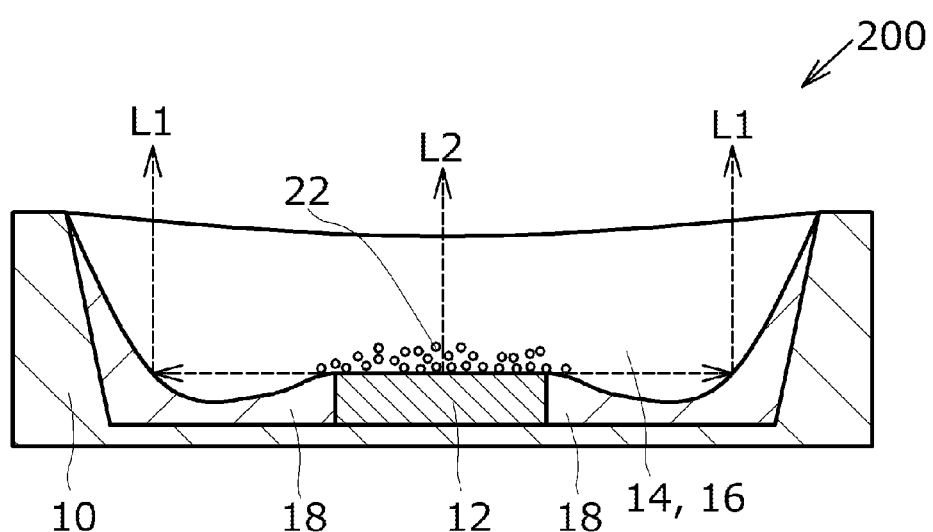
FIG. 2G is a schematic cross-sectional view illustrating a seventh step of a method for manufacturing a light-emitting device according to the second embodiment.
Figure 3A:
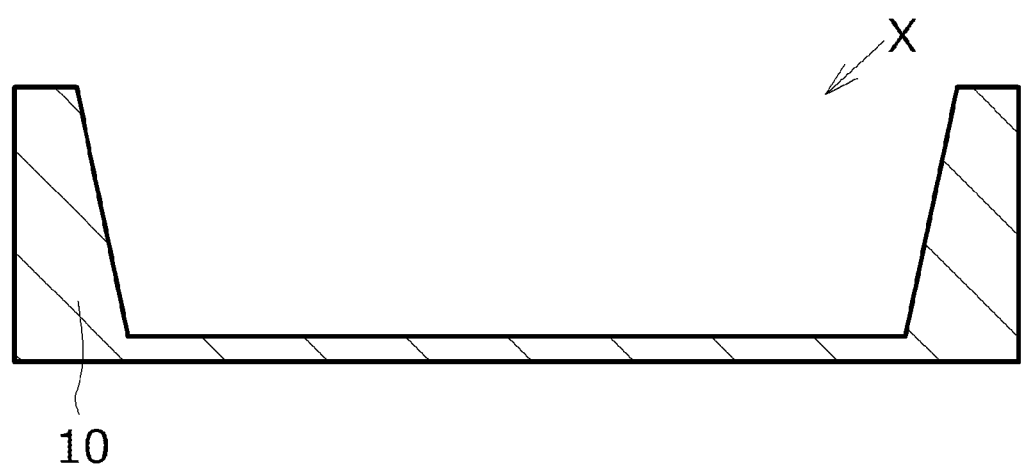
FIG. 3A is a schematic cross-sectional view illustrating a first step of a method for manufacturing a light-emitting device according to a third embodiment.
Figure 3B:
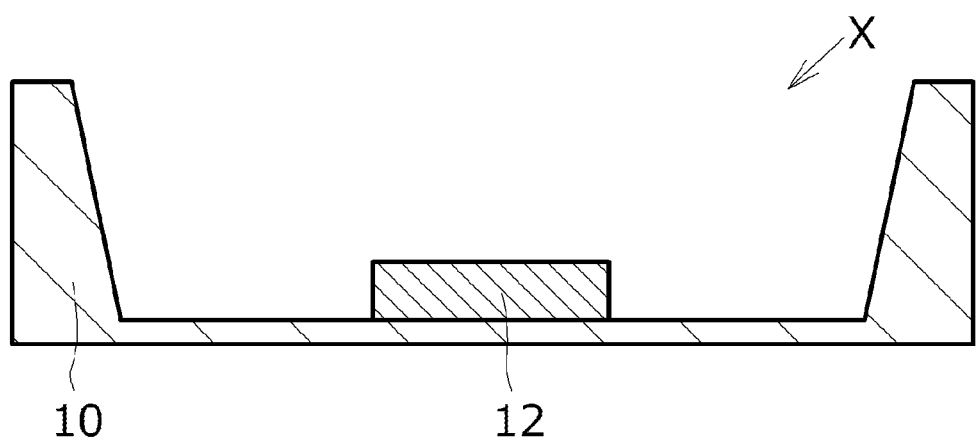
FIG. 3B is a schematic cross-sectional view illustrating a second step of a method for manufacturing a light-emitting device according to the third embodiment.
Figure 3C:
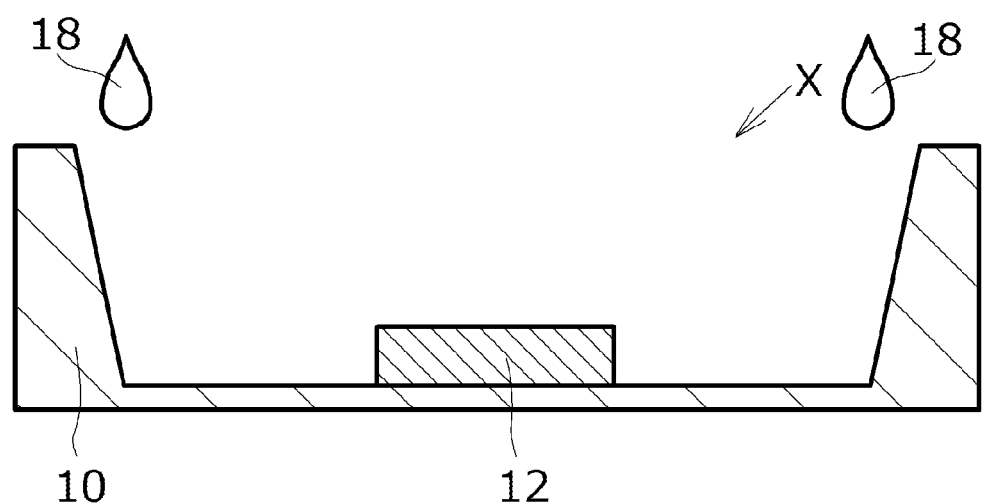
FIG. 3C is a schematic cross-sectional view illustrating a third step of a method for manufacturing a light-emitting device according to the third embodiment.
Figure 3D:
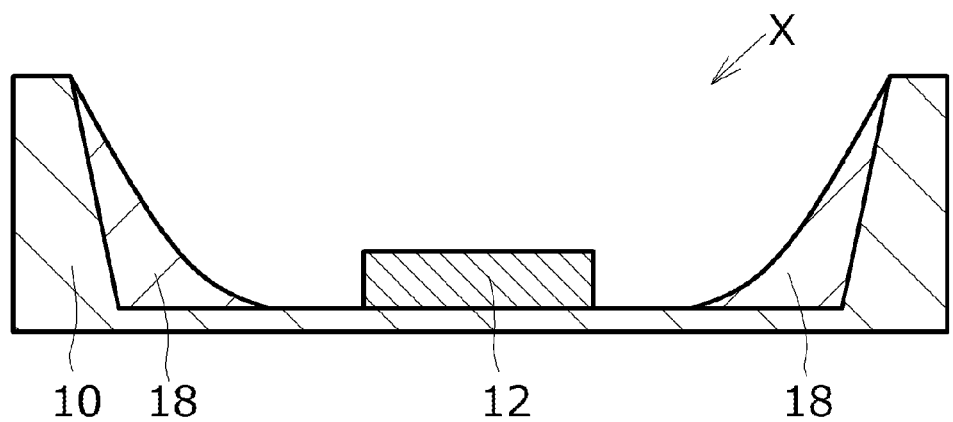
FIG. 3D is a schematic cross-sectional view illustrating a fourth step of a method for manufacturing a light-emitting device according to the third embodiment.
Figure 3E:
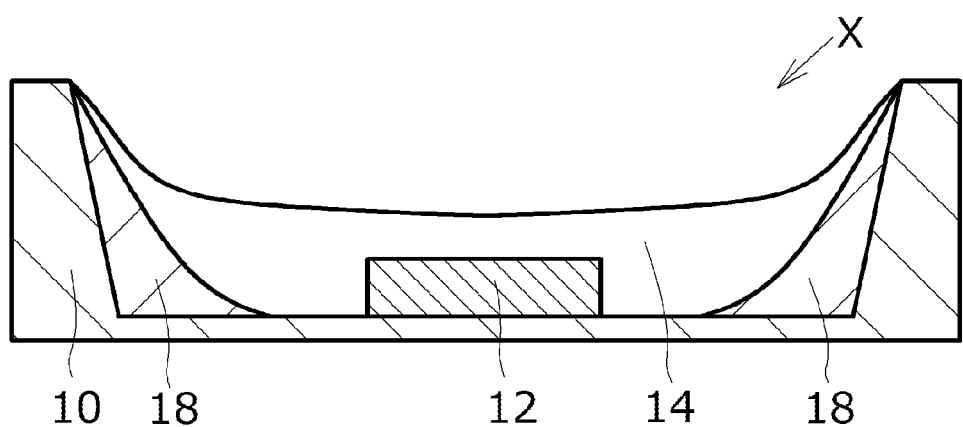
FIG. 3E is a schematic cross-sectional view illustrating a fifth step of a method for manufacturing a light-emitting device according to the third embodiment.
Figure 3F:
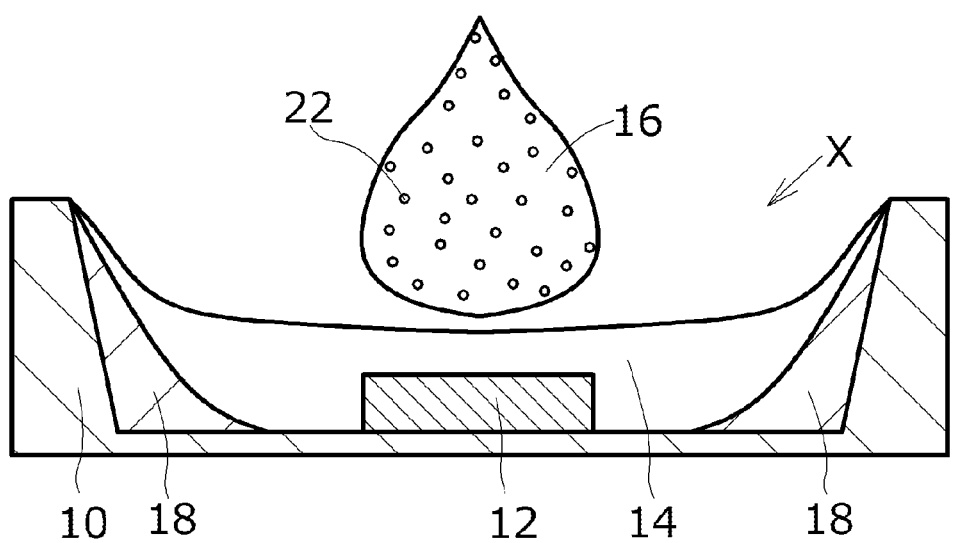
FIG. 3F is a schematic cross-sectional view illustrating a sixth step of a method for manufacturing a light-emitting device according to the third embodiment.
Figure 3G:
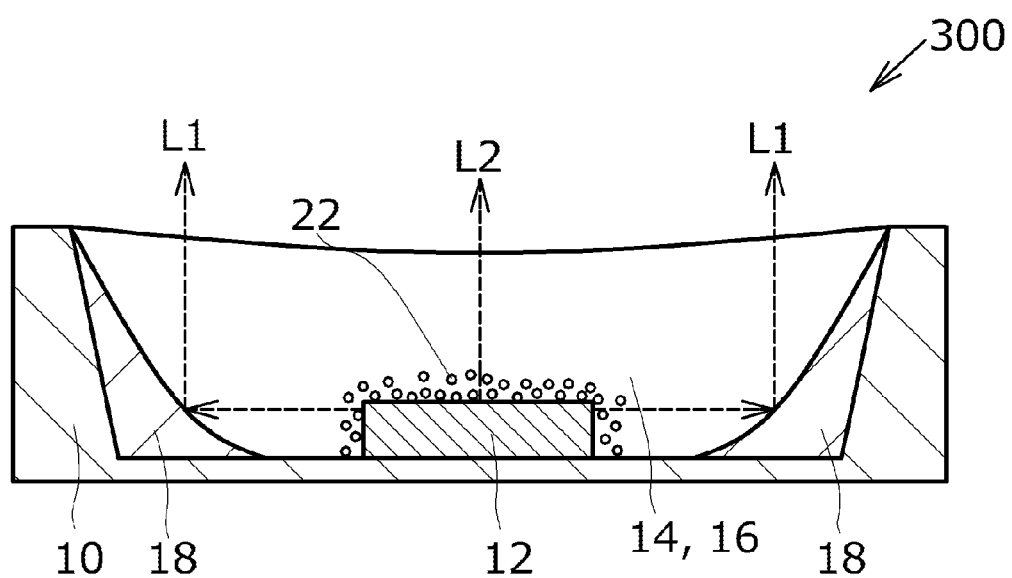
FIG. 3G is a schematic cross-sectional view illustrating a seventh step of a method for manufacturing a light-emitting device according to the third embodiment.

As illustrated in FIG. 1E, a light-emitting device 100 according to a first embodiment includes a base 10 having a recess X, a light-emitting element 12 arranged on the bottom surface of the recess X, members (a first member 14 and a second member 16, described below) that cover the light-emitting element 12 and that are filled in the recess X, and phosphor 22 arranged at, or in the vicinity of, the light-emitting element 12, which itself is arranged on the bottom surface of the recess X. The phosphor 22 is not uniformly dispersed in the recess X, but the majority of phosphor 22 is arranged more densely in the periphery of the light-emitting element 12. The light-emitting device 100 according to the first embodiment does not have an interface between the first member 14 and the second member 16. With the light-emitting device 100 according to the first embodiment, reflection of light emitted from the light-emitting element 12 at the interface between the first member 14 and the second member 16 does not occur, so that light extraction efficiency can be improved.

Method for Manufacturing Light-Emitting Device According to First Embodiment

FIGS. 1A to 1E are schematic cross-sectional views illustrating the method for manufacturing the light-emitting device according to the first embodiment of the present invention. Hereinafter, the manufacturing method according to the present embodiment will be described referring to FIGS. 1A to 1E.

First Step

As illustrated in FIG. 1A, the base 10 having the recess X is provided. The recess X is arranged on an upper surface side of the base 10. The recess X mainly has a bottom surface and an inner wall surface that continuously extends from the bottom surface to the upper surface of the base 10, and wirings made of, for example, lead frames or metal members are arranged on the bottom surface of the recess X. The light-emitting element 12 is arranged on the bottom surface of the recess X, and the light-emitting element 12 in the recess X is sealed with the first member 14 and the second member 16.

The base 10 is made of, for example, materials having insulation properties, such as resin materials and ceramics. The recess X may have any appropriate shape. Examples of a plan shape of each of the bottom surface and the upper surface include a circle, ellipse, square, rectangle, polygon, and modified versions thereof (e.g., shapes having a rounded corner or a notch). The inner wall surface may be perpendicular to the bottom surface, but the inner wall surface may be inclined with respect to the bottom surface so that the inner wall surface has a tapered shape in which the width of the recess increases from the bottom surface to the upper surface side, so as to adjust the light distribution of the light-emitting device.

It is preferable that the height of an inner wall of the recess X from the bottom surface of the recess X be higher than the height of an upper surface of the light-emitting element 12 arranged in the recess X from the bottom surface of the recess X. With this configuration, the second member 16 can easily transfer to a lower portion of the first member 14, and the second member 16 can easily be arranged in the vicinity of the light-emitting element 12, as will be described in subsequent steps.

Second Step

Next, the light-emitting element 12 is arranged on the bottom surface of the recess X. As illustrated in FIG. 1B, the light-emitting element 12 is arranged in the vicinity of the center of the bottom surface of the recess X. The light-emitting element 12 is connected to the wiring arranged on the bottom surface of the recess X. The light-emitting element 12 is a semiconductor light-emitting element, and any element that operates to emit light may be employed for the light-emitting element, including a light-emitting diode. For example, the light emitting element may include a stacked structure including a light emitting layer that is formed on a growth substrate such as a sapphire substrate or GaN substrate. The stacked structure may be made of various semiconductors, and examples of the material for the stacked structure include nitride semiconductors such as InN, AlN, GaN, InGaN, AlGaN, InGaAlN, group III-V compound semiconductors, or group II-VI compound semiconductors. The light emission wavelengths of the light-emitting element 12 can be appropriately selected, and the light emission wavelength can be selected from an ultraviolet region to an infrared region. For example, the light-emitting element 12 may include a p-side pad electrode and an n-side pad electrode that are arranged on a same surface side thereof or on sides thereof opposite to each other. The light-emitting element 12 may be mounted on the wirings in any appropriate manner and, for example, may be mounted in a wire-bonding manner or flip-chip manner. It will be understood that, while one light-emitting element is arranged in the recess X in FIG. 1B, any appropriate number of light-emitting elements may be arranged in the recess X, and further understood that one or plural light-emitting elements may be employed.

Third Step

Next, as illustrated in FIG. 1C, the first member 14 is dropped into the recess X so that the first member 14 continuously covers the upper surface of the light-emitting element 12 and the inner wall of the recess X. As used herein, the term "continuously cover" means to cover the upper surface of the light-emitting element 12 and the inner wall of the recess X so that a portion of the first member 14 that covers the upper surface of the light-emitting element 12 and a portion of the first member 14 that covers the inner wall of the recess X are connected.

The first member 14 is a member mainly made of a resin material. For example, the resin materials may contain a filler such as phosphor 20 or a light diffusing agent. In this case, the first member 14 is formed of the resin material and the filler contained in the resin material. For the first member 14, any appropriate material having insulation properties, allowing transmission of the light emitted from the light-emitting element 12, and having fluidity before curing, may be used. Examples of such materials include epoxy resin, epoxy modified resin, silicone resin, silicone modified resin, phenol resin, polycarbonate resin, acrylic resin, TPX resin, polynorbornene resin, or hybrid resin that includes one or more of the aforementioned resins. Among these examples, a thermosetting resin having good thermal resistance is preferably employed, and more preferably, silicone resin or epoxy resin having good insulation properties and weather resistance may be employed.

The first member 14 is applied in the recess X so as to cover the upper surface of the light-emitting element 12. The amount of the first member 14 that is applied in the recess X is determined by subtracting the amount of the second member 16 that has been applied from the total amount of members applied in the recess X (in the present embodiment, this refers to the sum of the applied amount of the first member 14 and the applied amount of the second member 16 in the recess X), in consideration of the amount of second member 16 dropped in the subsequent steps. The applied amount of first member 14 in the recess X is smaller than the total applied amount of members in the recess X, so that the first member 14 applied in the recess X is arranged on the lower side of the recess X. In this case, the first member 14 is pulled up the inner wall of the recess X due to surface tension of the first member 14, and accordingly the upper surface of the first member 14 applied in the recess X has a concave shape. The amount of the first member 14 or the second member 16 that is applied is determined depending on the selection of resin materials used for each of the first member 14 and the second member 16 or concentration of the filler (e.g., phosphors) contained in each of the first member 14 and the second member 16. In the case where the first member 14 or the second member 16 contains the filler, the applied amount of the first member 14 or the second member 16 is determined not only based on the amount of resin materials but also based on the total amount of the first member 14 and the second member 16 along with the amount of the filler contained in the first member 14 and the second member 16.

Fourth Step

Next, as illustrated in FIG. 1D, the second member 16 is dropped into the recess X before the full curing of the first member 14. The second member 16 may have a higher specific gravity than the first member 14, and the second member 16 may be primarily made of resin materials. The resin materials may contain the filler such as the phosphor 22 or the light diffusing agent. In this case, the second member 16 is formed of the resin material and the filler contained in the resin material.

The specific gravity of the first member 14 and the second member 16 are determined depending on the selection of resin materials used, or on the concentration or particle diameter of the filler contained in each member. In the case where the first member 14 or the second member 16 contains the filler, the specific gravity of the first member 14 or the second member 16 is determined not only based on the resin materials but also based on the entire first member 14 and the entire second member 16 including the filler. More specifically, for example, each of cases (1) to (3) described below are examples in which the specific gravity of second member 16 is higher than the specific gravity of the first member 14.

Case (1): The specific gravity of resin materials used for the first member 14 and the second member 16 differs, and accordingly the specific gravity of an entirety of the second member 16 is higher than the specific gravity of an entirety of the first member 14.

Case (2): The specific gravity of resin materials used for the first member 14 and the second member 16 are the same, but the specific gravity of the filler such as the phosphors 20 and 22 contained in the first member 14 and the second member 16 differs, so that the specific gravity of the entirety of the second member 16 is higher than the specific gravity of the entirety of the first member 14. Alternatively, the filler is contained in the second member 16, but not contained in the first member 14.

Case (3): Although the specific gravity of resin materials used for the first member 14 and the second member 16 may be the same, and the specific gravities of the fillers, such as phosphors 20 and 22, contained in the first member 14 and the second member 16 may also be the same, a larger amount of fillers are contained in the second member 16 compared with the first member 14 (that is, the concentration of the filler in the second member 16 is higher than the concentration of the filler in the first member 14), so that the specific gravity of the entirety of the second member 16 is higher than the specific gravity of the entirety of first member 14.

Dropping the second member 16, which has a higher specific gravity than the first member 14, into the recess X in which the first member 14 has already been applied allows the second member 16 to transfer to a lower side of the first member 14. That is, when dropped on the upper surface of the first member 14, the second member 16 transfers from an upper surface side of the first member 14 to the lower side of the recess X and in doing so, raises the first member 14 to an upper side of the recess X. In other words, the second member 16 moves into the first member 14 to be arranged on the lower side of the recess X.

In the case where the light-emitting element 12 is arranged in the vicinity of the center of the bottom surface of the recess X, it is preferable that the second member 16 be dropped from above the center of the recess X. Dropping the second member 16 from above the center of the recess X allows the second member 16 to be selectively arranged in the vicinity of the center of the bottom surface of the recess X, so that the pulling of the second member 16 on the inner wall surface of the recess X can be reduced as compared with dropping the second member 16 before the first member 14. Alternatively, in the case where the light-emitting element 12 is arranged on a portion other than the vicinity of the center of the bottom surface of the recess X, it is preferable to drop the second member 16 from above the light-emitting element 12 (e.g., from directly above the light-emitting element 12). Dropping the second member 16 from directly above the light-emitting element 12 allows the second member 16 to be selectively arranged in the vicinity of the light-emitting element 12. In addition, if a plurality of light-emitting elements 12 are arranged in the recess X, it is preferable that the second member 16 be dropped from above the approximate center of the plurality of light-emitting elements 12. Dropping the second member 16 from above the plurality of light-emitting elements 12 allows the second member 16 to be arranged in the vicinity of the plurality of light-emitting elements 12.

As described above, the first member 14 and the second member 16 are primarily made of a resin material, and this material may contain a filler such as the phosphor 22 and the light diffusing agent. In this case, the first member 14 and the second member 16 are formed of the resin material and the filler contained in the resin material. If the phosphors 20 and 22 are used, for example, they can be materials that can be excited by the light emitted from the light-emitting elements 12 and consequently emit light having a wavelength that is different from the wavelength of the light emitted from the light-emitting elements 12 can be employed. Examples of materials for the phosphors 20 and 22 include yttrium aluminum garnet (YAG) based phosphors activated by cerium, lutetium aluminum garnet (LAG) based phosphors activated by cerium, nitrogen-containing calcium alumino-silicate ($CaO—Al_2O_3—SiO_2$) based phosphors activated by europium and/or chromium, silicate (($Sr, Ba)_2SiO_4$) based phosphors activated by europium, β SiAlON phosphors, chlorosilicate phosphor, nitride based phosphors such as CASN based or SCASN based phosphors, rare earth metal nitride phosphors, oxynitride phosphor, KSF ($K_2SiF_6$: Mn) based phosphors, sulfide based phosphors, and the like. With use of these materials for the phosphors 20 and 22, a light-emitting device to emit mixed color light (e.g., white light), which is a mixture of the primary light having a wavelength of visible light and the secondary light, or a light-emitting device to emit the secondary light having a wavelength of visible light by being excited by the primary light that is ultraviolet light can be provided. For example, in the case where a light-emitting element that emits blue light is used as the light-emitting element 12, it is preferable that a phosphor that is to be excited by blue light and to emit yellow, broad light emission be employed as the phosphors 20 and 22. It is understood that the phosphors 20 and 22 may be made of a material of single type, or may be the combination of materials of two or more types having compositions different from each other. In this case, the compounding ratio of the materials of two or more types may be adjusted, so that desired color rendering properties or a desired color reproductivity can be obtained.

As another example, luminescent materials, including nano-crystal or quantum dot materials, may also be employed for the phosphors 20 and 22. Examples of luminescent materials include semiconductor materials such as group II-VI, group III-V, or group IV-VI semiconductors, more specifically, nano-size high dispersed particles such as CdSe, core shell type CdSXSe1-X/ZnS, GaP, InAs. Also, the luminescent materials may have, for example, particle diameter in a range of 1 to 100 nm, preferably, approximately 1 to 20 nm (including approximately 10 to 50 atoms). With use of such luminescent materials for the phosphors 20 and 22, scattering of light inside the phosphors 20 and 22 can be reduced, which allows scattering of color-converted light to be reduced, and therefore the light transmissivity of the phosphors 20 and 22 can be further improved.

As another example, organic luminescent materials can also be employed for the phosphors 20 and 22. For example, a luminescent material using organometallic complex may be used. Many of such luminescent materials have high light-transmissiveness, so that, in the case where the organic luminescent materials are employed as the phosphors 20 and 22, an effect similar to the effect of using the quantum dot can be obtained.

For example, silica, titanium oxide, zirconium oxide, magnesium oxide, magnesium carbonate, magnesium hydroxide, calcium carbonate, calcium hydroxide, calcium silicate, zinc oxide, barium titanate, or aluminum oxide can be employed for the light diffusing agent.

In addition to the aforementioned phosphors and the light diffusing agents, examples of the material for the filler contained in the resin material include a fibrous filler such as a glass fiber and wollastonite, and an inorganic filler such as carbon black, and materials having high heat dissipation (e.g., aluminum nitride and boron nitride).

It is preferable that the step of dropping the second member 16 includes semi-curing of the first member 14. That is, it is preferable that the first member 14 be semi-cured concurrently with the dropping of the second member 16. In other words, it is preferable that the second member 16 is dropped while the first member 14 is semi-cured.

Fifth Step

Next, as illustrated in FIG. 1E, the first member 14 and the second member 16 are fully cured. Fully curing the first member 14 and the second member 16 simultaneously after the completion of the dropping of the second member 16 can reduce excessive transfer of the second member 16 in a horizontal direction, so that the second member 16 can be arranged in a desired portion (e.g., only in the vicinity of the light-emitting element 12). In the case where the second member 16 is formed of the same resin material as that of the first member 14, the first member 14 and the second member 16 can be simultaneously cured in the same step under the same curing condition. It is noted that, as for an outer surface shape of the first member 14 and the second member 16 after the complete curing, it is not necessary that the upper surfaces of the first member 14 and the second member 16 are flat. The upper surfaces of the first member 14 and the second member 16 may have a protrusion or a recess.

As used herein, "full curing" means that the resin is completely cured, and "semi-curing" means that the resin is cured to the effect that the fluidity of the resin is suppressed. The full curing and the semi-curing processes described above may be performed using any appropriate technique, such as heating, using catalyst, irradiating ultraviolet rays, and irradiating radioactive rays.

For example, in the case where both the first member 14 and the second member 16 are formed of thermosetting resin, it is preferable to drop the second member 16 while heating the first member 14 to a temperature at which the first member 14 is not fully cured. With this arrangement, the full curing can be swiftly performed after the second member 16 is dropped, so that excessive spread of the second member 16 can be reduced. That is, an area of a region on which the second member 16 is arranged can be easily controlled.

As described above, in the method for manufacturing the light-emitting device 100 according to the first embodiment, the second member 16, the specific gravity of which is higher than the specific gravity of the first member 14, is dropped into the recess X before the full curing of the first member 14. With this arrangement, the second member 16 can be easily arranged in the vicinity of the light-emitting element 12, (in particular, in the case where the phosphor 22 is contained in the second member 16, the phosphor 22 can be easily arranged in the vicinity of the light-emitting element 12), and the formation of the interface between the first member 14 and the second member 16 can be suppressed. Consequently, the light-emitting device having good light extracting efficiency can be provided.

Also, with the method for manufacturing the light-emitting device 100 according to the first embodiment, when the first member 14 is in the state before the full curing allows the second member 16 to be arranged preferentially in the vicinity of the light-emitting element 12. For example, in the case where the phosphors 22 is contained in the second member 16, the light-emitting device with reduced color unevenness can be provided. That is, with the method for manufacturing the light-emitting device 100 according to the first embodiment, when the first member 14 is in the state before the full curing allows the second member 16, which is dropped into the recess X, to stay in the vicinity of the light-emitting element 12 so that the second member 16 does not spread into the whole of the recess X. Accordingly, the second member 16 does not spread in the whole of the recess X immediately after being dropped into the recess X, and instead gradually spreads in the whole of the recess X. Consequently, in the case where the second member 16 contains the phosphor 22, larger amount of the phosphor 22 is accumulated above the light-emitting element 12 or in the periphery of the light-emitting element 12.

An optical path length, which is a distance of the light emitted from the light-emitting element 12 passing through the first member 14 and the second member 16 that seal the interior of the recess X, varies depending on the light extraction direction. Accordingly, in the case where the phosphor 22 spread in the whole of the recess X and is accumulated there, a larger amount of phosphor 22 is present on an optical path L1, which is a path on which a light from the light-emitting element 12 that advances to a lateral side of the light-emitting element 12 is reflected on the inner wall of the recess X and is extracted to the outside of the recess X, than on an optical path L2, which is a path on which a light from the light-emitting element 12 that advances above the recess X is extracted to the outside of the recess X. That is, in this case, a larger amount of phosphor 22 on a region of the recess X surrounding the light-emitting element 12 is excited by the light emitted from the light-emitting element 12 than an amount of phosphor 22 on a region of the recess X above the light-emitting element 12. Accordingly, a larger amount of light having a wavelength that is converted by the phosphor 22 is emitted from the region of the recess X surrounding the light-emitting element 12, so that a difference exists between the chromaticity of the light emitted from the region of the recess X above the light-emitting element 12 and the chromaticity of the light emitted from the region of the recess X surrounding the light-emitting element 12, which leads to significant color unevenness.

However, with the method for manufacturing the light-emitting device 100 according to the first embodiment, as described above, the first member 14 in the state before the full curing allows the second member 16 to be preferentially arranged in the vicinity of a region on which the light-emitting element 12 is arranged. By doing so, a difference between the amount of phosphor being present on the optical path L1, which is a path on which the light from the light-emitting element 12 advances laterally is reflected on the inner wall of the recess X and is extracted to outside of the recess X, and the amount of phosphor being present on the optical path L2, which is a path on which the light from the light-emitting element 12 that advances above is extracted to outside of the recess X, can be reduced. Consequently, with the method for manufacturing the light-emitting device 100 according to the first embodiment, where the phosphor 22 is contained in the second member 16, the light-emitting device with reduced color unevenness can be provided.

With the method for manufacturing the light-emitting device 100 according to the first embodiment, the second member 16 is preferentially arranged in the vicinity of the region on which the light-emitting element 12 is arranged. In other words, the second member 16 is arranged so as to be separated from a light emission surface of the light-emitting device 100. With this arrangement, in the case where the phosphor 22 is contained in the second member 16, the phosphor 22 is not arranged in an outer surface of the light-emitting device and not exposed to the outside. Accordingly, the method for manufacturing the light-emitting device 100 of the first embodiment is particularly suitable for the manufacturing of the light-emitting device in which the phosphor 22 that is vulnerable to gas or water are used.

In Case (1), in which the resin materials having different specific gravity are used for the first member 14 and the second member 16 so that the specific gravity of the second member 16 is higher than the specific gravity of the first member 14 as noted above, it is preferable for example, that the second member 16 be formed of a resin material having a higher heat resistance than that of the first member 14. With this arrangement, the second member 16 having a higher heat resistance can be selectively arranged in the vicinity of the light-emitting element, so that the deterioration or discoloration of the resin covering the light-emitting element 12, which is due to the heat from the light-emitting element 12, can be greatly reduced, and the decrease in light emission efficiency of the light-emitting device 100 can be reduced. In Case (2), in which the fillers having different specific gravity are respectively contained in the first member 14 and the second member 16 to make the specific gravity of the second member 16 be higher than the specific gravity of the first member 14, or in Case (3), in which the concentration of the filler in the first member 14 differs from the concentration of the filler in the second member 16 to make the specific gravity of the second member 16 be higher than the specific gravity of the first member 14, the filler contained in the second member 16 can be easily arranged in a desired place in the recess X, so that, in particular, in the case where the phosphor 22 is contained in the second member 16, the phosphor 22 is arranged closer proximity of the light-emitting element 12. Accordingly, the light-emitting device with further reduced color unevenness can be provided.

Method for Manufacturing Light-Emitting Device 200 According to Second Embodiment FIGS. 2A to 2G are schematic cross-sectional views illustrating a method for manufacturing the light-emitting device according to a second embodiment. As illustrated in FIGS. 2A to 2G (and in particular, in FIGS. 2C and 2D), the method for manufacturing a light-emitting device 200 according to the second embodiment is different from the method for manufacturing the light-emitting device 100 according to the first embodiment in that a light reflecting member 18, having a light reflectivity that is higher than that of a first member 14 and a second member 16, is dropped into a recess X before the first member 14 is dropped, and the bottom surface of the recess X and a lateral surface of a light-emitting element 12 are covered by the light reflecting member 18. The light reflecting member 18 is dropped such that it is not dropped from directly above the light-emitting element 12, but from above a portion between the light-emitting element 12 and a lateral wall of the recess X so that an upper surface of the light-emitting element 12 is exposed. In the case where the light reflecting member 18 is dropped in this manner, the light reflecting member 18 is pulled up the lateral surface of the light-emitting element 12, and the lateral surface of the light-emitting element 12 is covered by the light reflecting member 18. With the method for manufacturing the light-emitting device 200 according to the second embodiment, the bottom surface of the recess X and the lateral wall of the light-emitting element 12 are covered by the light reflecting member 18 having a higher light reflectivity than that of the first member 14 and the second member 16, so that the light extracting efficiency of the light-emitting device 200 can be further increased.

The light reflecting member 18 can be formed of a light reflective material having high light reflectivity. For example, the reflectivity of the light reflective material with respect to light emitted from the light-emitting element 12 is preferably 60 percent or higher, more preferably, 80 or 90 percent or higher. For the light reflective material, a resin material containing a light reflective substance can be used. Examples of the resin material include resin containing one or more of silicone resin, silicone modified resin, epoxy resin, epoxy modified resin, acrylic resin, or hybrid resin. It is preferable to employ a resin that contains a silicone resin, which has good heat resistance, good electrical insulation properties, and flexibility, as a base polymer of the resin. For the light reflective substance, silica, titanium oxide, zirconium oxide, magnesium oxide, magnesium carbonate, magnesium hydroxide, calcium carbonate, calcium hydroxide, calcium silicate, zinc oxide, barium titanate, aluminum oxide, orthe like can be employed. It is preferable to employ the titanium oxide because it is relatively stable with respect to water and it has a high refractive index. Also, a fibrous filler such as a glass fiber or wollastonite, and an inorganic filler such as carbon black, and materials having high heat dissipation (e.g., aluminum nitride or boron nitride) may be contained in the light reflective materials.

The light reflecting member 18 can be dropped and cured in the same manner as that of the first member 14 and the second member 16. It is preferable that the light reflecting member 18 be semi-cured or fully cured before the dropping of the first member 14 and the second member 16. That is, it is preferable that the interfaces between the light reflecting member 18 and the first member 14, and between the light reflecting member 18 and the second member 16, are formed. Accordingly, a light emitted from the light-emitting element 12 is reflected on a surface of the light reflecting member 18, so that the light extracting efficiency of the light-emitting device 200 can be improved.

Method for Manufacturing Light-Emitting Device 300 According to Third Embodiment FIGS. 3A to 3G are schematic cross-sectional views illustrating the method for manufacturing the light-emitting device according to a third embodiment. As illustrated in FIGS. 3A to 3G, the method for manufacturing a light-emitting device 300 according to the third embodiment is different from the method for manufacturing the light-emitting device 100 according to the first embodiment in that a light reflecting member 18, having a light reflectivity that is higher than that of a first member 14 and a second member 16, is dropped into a recess X before the first member 14 is dropped, and a bottom surface of the recess X and a lateral surface of the recess X are covered by the light reflecting member 18. Also, the method for manufacturing the light-emitting device 300 according to the third embodiment is different from the method for manufacturing the light-emitting device according to the second embodiment in that the light reflecting member 18 and the light-emitting element 12 are arranged apart from each other. In order to arrange the light reflecting member 18 to be apart from the light-emitting element 12, the light reflecting member 18 is dropped not from directly above the light-emitting element 12 but instead from above a portion between the light-emitting element 12 and the lateral wall of the recess X that is closer to the lateral wall of the recess X than to the light emitting element so that an upper surface and a lateral surface of the light-emitting element 12 are exposed. For example, in the case where the bottom surface of the recess X has a substantially rectangular shape, it is preferable that the light reflecting member 18 be dropped into the vicinity of four corners of the substantially rectangular shape. With this arrangement, the light reflecting member 18 wets and spreads along the lateral surface of the recess X to form a continuous reflective curved surface. The light reflecting member 18 is semi-cured or fully cured in a state where the continuous reflective curved surface has been formed.

According to the method for manufacturing the light-emitting device 300 of the third embodiment, the bottom surface and the lateral surface of the recess X are covered by the light reflecting member 18 whose light reflectivity is higher than that of the first member 14 and the second member 16, so that the light extraction efficiency of the light-emitting device can be further improved. Moreover, the light reflecting member 18 and the light-emitting element 12 are arranged apart from each other, similarly to the method for manufacturing the light-emitting device 100 according to the first embodiment, and the second member 16 is preferentially arranged in the vicinity of the lateral surface of the light-emitting element 12. Accordingly, in particular, in the case where the phosphor 22 is contained in the second member 16, the phosphor 22 can be preferentially arranged in the vicinity of the upper surface and the lateral surface of the light-emitting element 12, so that the light-emitting device 300 with reduced color unevenness can be provided.

Although the disclosure has been described with reference to several exemplary embodiments, it is to be understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular examples, means, and embodiments, the disclosure may be not intended to be limited to the particulars disclosed; rather the disclosure extends to all functionally equivalent structures, methods, and uses such as are within the scope of the appended claims.

The illustrations of the examples and embodiments described herein are intended to provide a general understanding of the various embodiments, and many other examples and embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more examples or embodiments of the disclosure may be referred to herein, individually and/or collectively, for convenience and without intending to voluntarily limit the scope of this application to any particular disclosure or inventive concept. Moreover, although specific examples and embodiments have been illustrated and described herein, it is to be appreciated that any subsequent arrangement designed to achieve the same or similar purpose may be substituted for the specific examples or embodiments shown. This disclosure may be intended to cover any and all subsequent adaptations or variations of various examples and embodiments. Combinations of the above examples and embodiments, and other examples and embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

The invention claimed is:

1. A method for manufacturing a light-emitting device, comprising:
   preparing a base that includes a recess;
   arranging a light-emitting element on a bottom surface of the recess;
   dropping a first member into the recess to continuously cover an upper surface of the light-emitting element and an inner wall of the recess by the first member;
   dropping a second member into the recess,
      wherein the second member has a higher specific gravity than the first member, and
      further wherein dropping the second member includes semi-curing the first member; and
   after the second member is dropped, fully curing the first member and the second member.

2. The method for manufacturing the light-emitting device according to claim 1,
   wherein the second member is formed of a same resin material as that of the first member.

3. The method for manufacturing the light-emitting device according to claim 1,
   wherein the first member and the second member are each formed of a resin material, and
   wherein the resin material of the second member has a higher heat resistance than the resin material of the first member.

4. The method for manufacturing the light-emitting device according to claim 1,
   wherein a phosphor is contained in the second member.

5. The manufacturing method for the light-emitting device according to claim 2,
   wherein a phosphor is contained in the second member.

6. The method for manufacturing the light-emitting device according to claim 4,
   wherein the second member is dropped from directly above the light-emitting element into the recess.

7. The method for manufacturing the light-emitting device according to claim 5,
   wherein the second member is dropped from directly above the light-emitting element into the recess.

8. The method for manufacturing the light-emitting device according to claim 1,
   wherein a phosphor is contained in the first member.

9. The method for manufacturing the light-emitting device according to claims 2,
   wherein a phosphor is contained in each of the first member and the second member, and
   wherein, the phosphor contained in the first member includes a material having a different composition than the composition of the phosphor contained in the second member.

10. A method for manufacturing a light-emitting device, comprising:
    preparing a base that includes a recess;
    arranging a light-emitting element on a bottom surface of the recess;
    dropping a light reflecting member into the recess, wherein the bottom surface of the recess and a lateral surface of the recess are covered by the light reflecting member;
    after the light reflecting member is dropped, dropping a first member into the recess to continuously cover an upper surface of the light-emitting element and an inner wall of the recess by the first member;
    dropping a second member into the recess, wherein the second member has a higher specific gravity than the first member; and
    after the second member is dropped, fully curing the first member and the second member,
    wherein the light reflecting member has a higher light reflectivity than the first member and the second member.

11. The method for manufacturing the light-emitting device according to claim 10,
    wherein the light reflecting member is arranged apart from the light-emitting element.

12. The method for manufacturing the light-emitting device according to claim 10,
    wherein the step of dropping the second member includes semi-curing the first member.

13. The method for manufacturing the light-emitting device according to claim 11,
    wherein the step of dropping the second member includes semi-curing the first member.

14. The method for manufacturing the light-emitting device according to claim 10, wherein a phosphor is contained in the second member.

15. The method for manufacturing the light-emitting device according to claim 10,
    wherein a phosphor is contained in each of the first member and the second member, and
    wherein the phosphor contained in the first member includes a material having a different composition than the composition of the phosphor contained in the second member.

* * * * *